(12) United States Patent
Kordina et al.

(10) Patent No.: US 8,197,596 B2
(45) Date of Patent: *Jun. 12, 2012

(54) CRYSTAL GROWTH METHOD AND REACTOR DESIGN

(75) Inventors: Olof Claes Erik Kordina, Pittsburgh, PA (US); Shailaja Rao, Pittsburgh, PA (US)

(73) Assignee: Pronomic Industry AB (SE)

( * ) Notice: Subject to any disclaimer, the term of this patent is extended or adjusted under 35 U.S.C. 154(b) by 1262 days.

This patent is subject to a terminal disclaimer.

(21) Appl. No.: 11/829,385

(22) Filed: Jul. 27, 2007

(65) Prior Publication Data

US 2008/0026546 A1    Jan. 31, 2008

Related U.S. Application Data

(60) Provisional application No. 60/833,951, filed on Jul. 28, 2006.

(51) Int. Cl.
*C30B 23/02* (2006.01)
(52) U.S. Cl. ........... 117/89; 117/105; 117/108; 117/109
(58) Field of Classification Search ............ 117/84, 117/108, 109, 105
See application file for complete search history.

(56) References Cited

U.S. PATENT DOCUMENTS

| | | | |
|---|---|---|---|
| 3,352,951 A | 11/1967 | Sara | |
| 5,493,985 A | 2/1996 | Bliss et al. | |
| 5,541,407 A | 7/1996 | Leone et al. | |
| 5,656,079 A | 8/1997 | Bliss et al. | |
| 5,873,937 A | 2/1999 | Hopkins et al. | |
| 6,019,841 A | 2/2000 | Jafri et al. | |
| 6,258,170 B1 | 7/2001 | Somekh et al. | |
| 6,562,131 B2 | 5/2003 | Vodakov et al. | |
| 7,112,242 B2 | 9/2006 | Hara et al. | |
| 7,147,714 B2 | 12/2006 | Naito et al. | |
| 7,323,052 B2 | 1/2008 | Tsvetkov et al. | |
| 7,377,977 B2 | 5/2008 | Motakef et al. | |
| 2002/0088391 A1 | 7/2002 | Kuhn et al. | |
| 2006/0280640 A1 | 12/2006 | Schlesser et al. | |
| 2007/0169687 A1 | 7/2007 | Kordina | |

FOREIGN PATENT DOCUMENTS

| | | |
|---|---|---|
| JP | 01-281392 | 11/1989 |
| JP | 2005-255472 | 9/2005 |
| WO | WO2006108089 A1 | 10/2006 |

OTHER PUBLICATIONS

Shi, Liang, et al., "Synthesis and oxidation behavior of nanocrystalline niobium carbide" *Solid State Ionics*, vol. 176, Issues 7-8, Feb. 28, 2005, Abstract.

Medeiros, F.F.P., et al., "Synthesis of niobium carbide at low temperature and its use in hardmetal," *Power Technology*, vol. 126, Issue 2, Jul. 4, 2002, Abstract.

(Continued)

*Primary Examiner* — Bob M Kunemund
(74) *Attorney, Agent, or Firm* — Shumaker, Loop & Kendrick, LLP

(57) ABSTRACT

A crystal growth process comprising providing a reactor having a crucible with an injector apparatus and a seed holder. The injector apparatus has an inner gas conduit and an outer gas conduit wherein an inert gas is introduced into the outer conduit. The injector apparatus has an upper injector and a lower injector and a gap therebetween. The upper injector temperature is maintained at a higher temperature than the lower injector.

51 Claims, 12 Drawing Sheets

OTHER PUBLICATIONS

Aggarwal, Gaurav, et al., "Development of niobium powder injection moding: Part I. Feedstock and injection molding," *International Journal of Refractory Metals and Hard Materials*, vol. 24, Issue 3, May 2006 (available online Aug. 10, 2005), Abstract.

Aggarwal, Gaurav, et al., "Development of niobium powder injection moding: Part II. Debinding and sintering," *International Journal of Refractory Metals and Hard Materials*, vol. 25, Issue 3, May 2007 (available online Jul. 10, 2006), Abstract.

Nixon, R. D., et al., "Steady-state creep behavior of hot isostatically pressed niobium carbide," *Materials Research Bulletin*, vol. 22, Issue 9, Sep. 1987, Abstract.

116

CRYSTAL GROWTH METHOD AND REACTOR DESIGN

This application is based on, and claims priority to, provisional application having Ser. No. 60/833,951, having a filing date of Jul. 28, 2006 and entitled Sintered Metal Carbides for High Temperature Applications.

FIELD OF THE INVENTION

The invention relates to crystal growth, and more particularly to systems and methods for use in growing crystals.

BACKGROUND OF THE INVENTION

In the field of electronics, silicon carbide (SiC), gallium nitride (GaN) aluminum nitride (AlN), and other similar materials are used in crystal form. Applicants' invention includes an improved system and method for growth of these crystals. Applicants' invention will be described in part as it applies to SiC crystal growth, but it can be used to grow GaN, AlN, and other similar crystals.

The traditional method of growing SiC is by seeded sublimation growth. In this method, a graphite crucible is filled with SiC powder and a SiC single crystal seed is attached to the lid of the crucible, which is then sealed. The system is heated to temperatures above 2000° C. where SiC sublimes, transforming from solid to vapor.

More recently, SiC had been grown using gas-fed techniques, in which precursors are introduced into the reactor by flowing them into the reactor in the gas phase, instead of using powders as is done in seeded sublimation. Two gas-fed techniques are High Temperature Chemical Vapor Deposition (HTCVD) and Phase Controlled Sublimation (PCS).

A variation of the PCS technique is Hydride Vapor Phase Epitaxy (HVPE). In HVPE, silicon tetrachloride (tetra) is transported together with an argon (Ar) carrier in the outer tube of a coaxial injector. The Ar carrier helps to insulate the inner tube containing the flow of hydrocarbon, which is ethylene or methane. The hydrocarbon is transported in a hydrogen carrier. The gases mix in the hot zone and the tetra decomposes and SiC is deposited on the seed.

Gas-based processes for SiC growth take place in a reactor. The reactor typically includes a crucible having a lid containing a seed holder, which is used to hold a SiC crystal. The SiC crystal serves as a seed for growth of additional SiC, which is deposited onto the seed. The silicon and carbon needed to grow the SiC are provided through a flow of gaseous precursors, for example silane and ethylene, which enter the crucible through one or more feed lines that are connected to an injector.

These gas-based processes operate at high temperatures. High temperatures and reactive precursor gases create a harsh environment that leads to wear and degradation of reactor components. This wear requires frequent replacement of reactor components and also creates contaminants that reduce the quality of the SiC crystals.

Traditionally the crucibles, injectors, and other reactor components have been made from graphite. More recently, there has been interest in components made from graphite coated with metal carbides and metal nitrides. Metal carbides and metal nitrides have several advantages: they have very high melting points; they are hard and strong; they are electrically conducting; and they are chemically inert to most chemicals also at high temperatures. For these reason coatings of metal carbides on graphite, e.g. TaC and NbC coatings, have been used to extend the life of graphite parts in harsh environments.

The metal-carbide and metal-nitride coatings are difficult to apply and they typically fail due to a mismatch of the Coefficient of Thermal Expansion (CTE) between the graphite and the metal carbide. For applications where thermal cycling is normal, the failure of the coating will become frequent. Furthermore in conditions where deposits of other materials occur on top of the metal carbide coating, the failure frequency is further increased.

There has been significant work using tantalum metal crucibles for silicon carbide crystal growth applications. The inner Ta surface is converted to TaC. Although these crucibles are normally quite durable, the lattice mismatch between Ta and TaC is very large; and an enormous stress is built into the thin converted carbide layer.

In gas-fed systems for crystal growth, the injector is the most exposed part of the reactor. The high temperatures in combination with the severe chemical reactivity of the silicon vapor and hydrogen gas make it absolutely necessary to use innovative materials or coatings for the injector. With a bare uncoated graphite injector, the opening diameter of the injector will increase from 25 mm diameter to 45 mm diameter in only 10 hours due to silicon and hydrogen etching. This increase in diameter reduces the growth rate of the crystal and changes the growth profile. Furthermore, large amounts of loose graphite particles are carried away with the gas stream and embedded into the growing crystal.

In an early attempt to reduce injector wear, a TaC coated injector was used. The injector worked, but the coating only lasted for one run; and then a new injector was required.

Accordingly, there is a need for reactor components with enhanced resistance to the high temperatures and corrosive gases described above. Similarly, there is a need for methods of growing SiC and similar crystals to take advantage of the new reactor components. There also is a need for methods for improving the resistance of reactor components to this environment.

Finally, there is a need for crystals and electronic components taking advantage of the superior crystal properties that rise from use of the devices and methods of the invention.

SUMMARY OF THE INVENTION

Embodiments of the present invention provide a novel reactor and methods for forming silicon carbide or other similar crystals, and semiconductor devices created with the crystals. Many of the embodiments of the invention provide improved crystal quality as compared to conventional crystal growth apparatus and methods.

Embodiments of the invention include a reactor having one or more of the following characteristics: metal carbide injectors; a metal carbide crucible; a metal carbide protective liner used in a non-metal carbide crucible; a concentric drool-and-washer structure for a seed holder with a gas purge; and a coating of niobium, niobium carbide, tungsten, or some combination thereof, along with a binder, the coating being painted onto a washer of a drool or onto another reactor component.

Embodiments of the invention also include methods for producing reactor components for use in crystal growth, the components being made from metal carbides such as niobium carbide or tantalum carbide.

Embodiments of the invention also include a method for protecting certain reactor components by applying a coating including niobium, niobium carbide, tungsten, tantalum or some combination thereof, preferably with a binder.

Embodiments of the invention also include a method of manufacturing a SiC or similar crystal by performing method steps using a reactor according to the invention.

Embodiments of the invention also include a method of manufacturing a semiconductor device, wherein the method includes the method of manufacturing a SiC or similar crystal using a reactor according to the invention.

Embodiments of the invention also include a SiC or similar crystal made by a method according to the invention and a semiconductor device comprising such a crystal.

DESCRIPTION OF DRAWINGS

The invention is best understood from the following detailed description when read with the accompanying drawings.

DETAILED DESCRIPTION OF THE INVENTION

As discussed above, the invention will be described in terms of its use for forming silicon carbide crystals, but the invention may also be used for a growing GaN, AlN, and other similar crystals. As such, the invention will be described by illustrative embodiments related to silicon carbide crystals.

For the embodiments of the invention related to the manufacturing and use of metal carbide components for crystal growth reactors, those methods will be described primarily with respect to illustrative embodiments using niobium carbide. Most of the discussion will be limited to NbC because this material is very suitable to the inventors' applications, but there is generally nothing that necessarily limits the choice of metal carbide to only NbC. Physical and chemical properties as well as weight and cost are important criteria when selecting a suitable metal carbide or metal nitride for the application. Resistance to corrosion from process gases and other negative effects from high temperature or varying temperature processes must also be considered when choosing a metal carbide.

Figure 1:
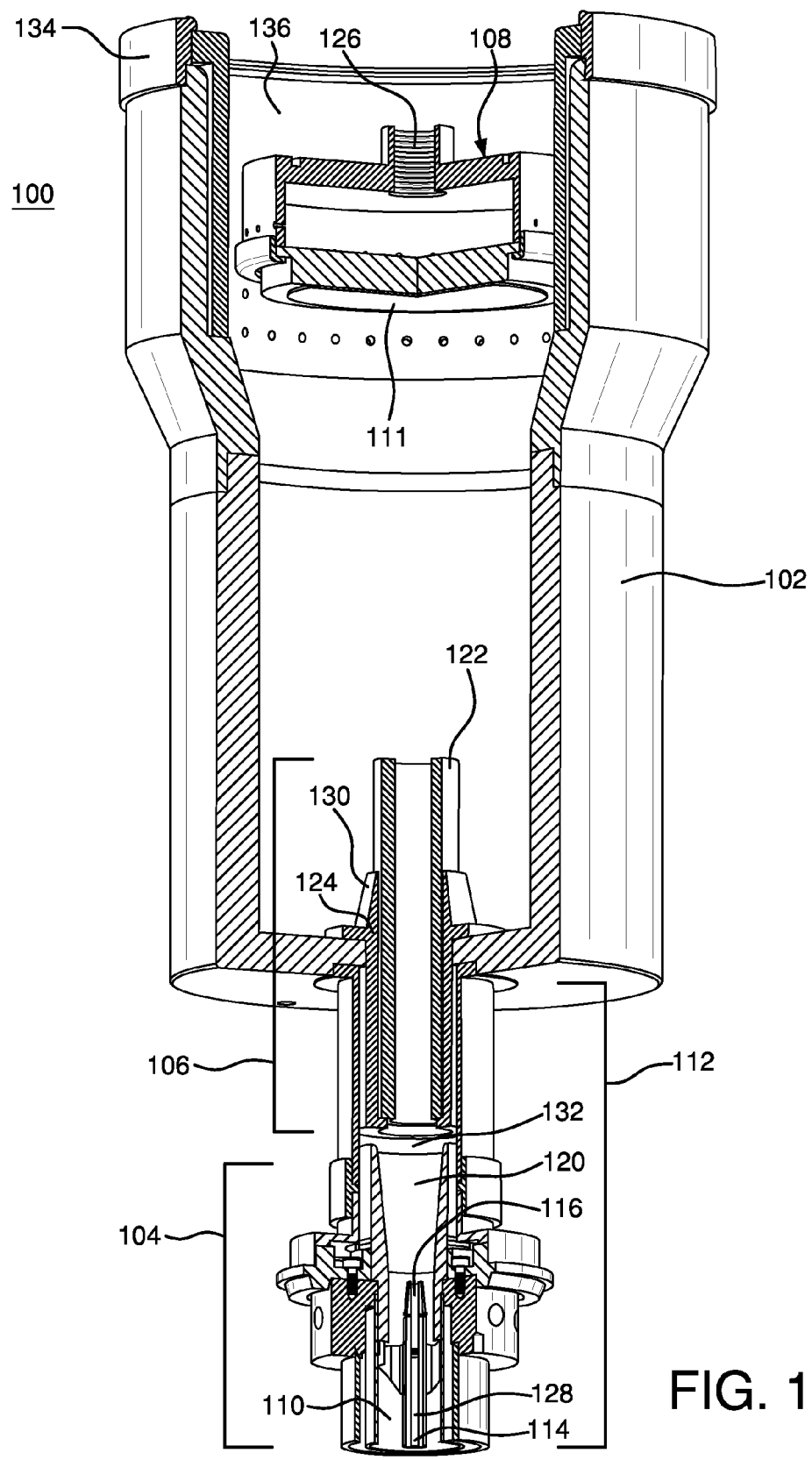
FIG. 1 depicts a reactor according to an illustrative embodiment of the invention.

FIG. 1 depicts a reactor 100 according to an illustrative embodiment of the invention. Reactor 100 includes crucible 102, lower injector section 104, upper injector section 106, and seed mount 111, which is mounted on a shaft at connection 126. At least a part of lower injector section 104 and upper injector section 106 are encased in outer casing 112. Outer casing 112 can comprise graphite, for example. Outer casing 112 can provide a number of functions. It can support the crucible and associated components, keeping them in proper relation to one another. It can also prevent the process gases from entering insulation surrounding the area, thereby reducing insulation degradation.

The upper injector section 106 begins upstream of the crucible 102 and passes through a wall of the crucible 102 into the crucible to provide a conduit for gases leading from outside the crucible 102 to inside the crucible. The upper injector section 106 comprises an upper injector 122 passing through a wall of the crucible 102 and into the crucible. The upper injector 122 is a body made from sintered metal carbide.

The lower injector section 104 is upstream from the upper injector section 102, the lower injector section 104 having a lower injector 120, the lower injector section 104 being spatially separated from the upper injector section 102 by a gap 132 of several millimeters. The lower injector 122 may comprise, for example, graphite or NbC. The lower injector section 104 comprises an outer gas conduit 110 and an inner gas conduit 114 substantially surrounded by the outer gas conduit 110, the inner gas conduit 114 being adapted to carry precursor gases for use in crystal growth, for example, silane and ethane. The inner gas conduit 114 has a downstream end, the downstream end having an inner gas nozzle 116 located thereon for ejecting gas into the lower injector 120. Optionally, inner gas nozzle 116 preferably has a channel for circulating a cooling fluid therein to control the temperature of the inner gas nozzle 116. Alternatively, or in addition, the wall to outer conduit 110 is water-cooled and may indirectly provide cooling to the inner gas conduit 110 and nozzle 1 16. Nozzle 116 is preferably stainless steel and is held into position by nozzle holder 128.

The lower injector 120 has a lower injector inner diameter that varies along its length and that has an upstream lesser injector inner diameter that is less than a downstream greater injector diameter thereof. The inner diameter of the lower injector 120 varies in generally linear fashion from a lesser diameter at an upstream location to a greater diameter at a downstream location. The lower injector 120 extends from within the outer casing to a point above the inner nozzle 116 to direct gas flow from the inner nozzle 116 into the crucible.

Downstream from the lower injector system 104 is upper injector section 106, which is preferably made of niobium carbide and is positioned so that there is a gap 132 of a few millimeters between the downstream end of lower injector 120 and the upstream end of upper injector 122. Upper injector 122 is preferably positioned so that its upstream end lies outside the crucible 102 in the upper injector section 106 and its downstream end lies within the crucible 102. The upper injector 122 is held within sleeve 124, which has flanges 130 thereon to position the injector 122, the upper injector section 106, and in turn the lower injector section 104 with respect to the crucible 102. Preferably sleeve 124 is made from or contains insulating material to prevent heat transfer between upper injector 122 and other components of the device. The crucible 102, sleeve 124, upper injector section 106, and lower injector section 104 are fastened together with mechanical hardware that is known to those of skill in the art.

The flow of gases from both inner gas conduit 114 and outer gas conduit 110 is directed through the lower injector 120, made from graphite or metal carbide. Lower injector 120 guides the gases towards the upper injector 122. It is important that the temperature in the lower injector 120 is not too high. A too-high temperature will change the characteristics of stray gas species that may reach the walls of the lower injector 120 such that they become more three-dimensional or dendritic in nature (and will cause blocking) rather than a smooth two-dimensional coating. The lower injector 120 is depicted as being shaped as an inverted frustum of a cone. Other shapes are possible, such as a uniformly cylinder with a uniform diameter. The upper injector 122 must be designed with care to allow a high flow of precursors and essentially no growth of these moving into the crucible 102. Silane or silicon reacts readily with the hydrocarbons and produces microcrystallites of SiC. These micro-crystallites are transported through the NbC injector into the chamber where they sublime and the sublimed products condense on the seed. The decomposition of the precursors generally happens at a low temperature. Therefore, they are preferentially injected through inner gas nozzle 116 in the center of a larger tube, outer gas conduit 110, which optionally may contain a flow of gases, such as helium or hydrogen, preferably mixed with argon to avoid premature deposition on the walls. This provides good thermal conductivity with low diffusivity.

The inner gas nozzle 116 is shaped in a very special manner with a narrow diameter that causes the precursors to inject into the crucible 102 at appreciable speed. However, a narrow diameter causes a lot of stray gas beams; therefore the inner gas nozzle 116 preferably extends for a distance with a larger inner diameter to catch all the strays and focus them upwards as much as possible. In an illustrative embodiment of the invention, the nozzle diameter is about 4 mm. An illustrative nozzle diameter range is about 3 mm to about 4 mm. In a further illustrative embodiment of the invention, a bi-diameter nozzle is used having a smaller diameter of about 1.7-1.9 mm and a larger diameter of about 3 mm.

A small flow of Ar in the outer flow, i.e. through outer gas conduit 110 can help focus the beam of precursors coming into the crucible and reduce or prevent growth on the walls of the lower injector 120. Advantageously, the sample may be observed during growth and the development of the facet can be observed, which is not possible with the traditional prior art method. This is because there are fewer stray clusters which enables observation of the sample throughout the growth run. Use of argon in this manner is particularly suitable for gas phase bulk growth processes.

It is noted that FIG. 1 depicts a single injector apparatus. It is in the spirit and scope of the invention to have more than one injector apparatus, for example, if precursors will be introduced into different areas of the reactor, or at different speeds.

Figure 2:
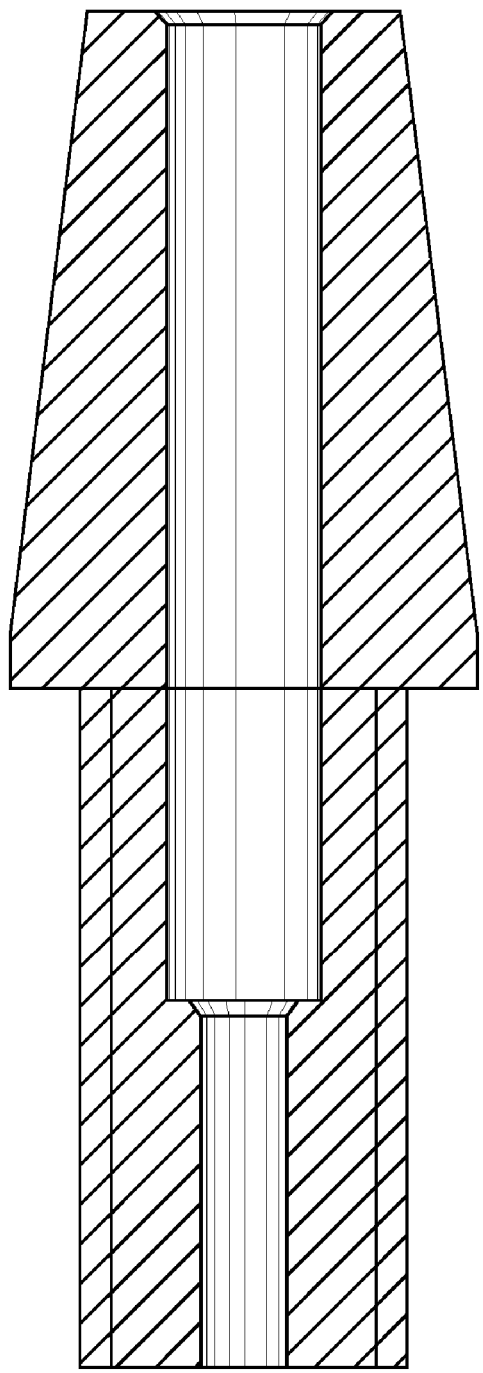
FIG. 2 depicts a cross section of a nozzle according to an illustrative embodiment of the invention.

FIG. 2 is a cross section of the inner gas nozzle 116 according to an illustrative embodiment of the invention. By adjusting the flows in the center tube through the inner gas nozzle 116, the device can create a very well focused beam or plume. It can even be so well focused that the rotating sample may be seen at the outer periphery of the plume of microcrystals.

A gap 132 of several millimeters separates the lower injector 120 from the upper injector 122. Ideally, in this gap the micro-crystallites should form and the temperature should increase rapidly. The gases will naturally pass through the upper injector 122 as outer casing 112 inhibits gases from escaping. Therefore very little gas escapes outside of the gap.

Injector 122 must be very hot. Generally, the hotter the better. Here it is hard to prevent the stray gases from reaching the surfaces of the upper injector 122, but if it is hot enough there will be no deposits on the walls, thereby keeping the upper injector 122 clean at all times. The only deposits will likely be pyrolytic graphite (PG) when run at very high C/Si ratios. Injector 122 is preferably inserted into the crucible volume where it is very hot, and thus picks up a lot of heat. In an illustrative embodiment of the invention, the temperature difference between the upper injector and the lower injector is in the range of about 5-° C. to about 500° C. A further illustrative range is about 100° C. to about 300° C.

When the application requires it, the preferred choice would be to use solid metal carbide or metal nitride reactor components if such components were easily available. Such objects may be created by the sintering of a metal carbide powder. This is however difficult to do technically as it requires a sintering temperature of approximately 70% of the melting point in order to achieve good sintering results. With a melting point of 3880° C. and 3500° C., respectively, TaC and NbC will require extreme sintering temperatures, making it technically prohibitive. Good densification can be achieved at lower temperatures if the hold time is increased, but sintering at temperatures below 70% of the melting point is generally not going to lead to well-sintered objects. A poorly sintered object will fail quicker than a well-sintered one.

CVD is an example of an application in which use of sintered metal carbides instead of coated graphite would be advantageous. The sintered objects can be used for a longer time and they can furthermore be baked at very high temperatures to remove deposits that may have accumulated on them. To speed up this process HCl and hydrogen can be introduced to aggressively etch off any deposits on the surfaces. This is similar to silicon technology where the graphite is etched with large amounts of HCl in between runs.

Bulk and epitaxial growth of GaN and related compounds will also see the same benefits of sintered metal carbide components. Graphite is a contaminant for the group III/N materials and it is difficult to find suitable materials for e.g. AlN bulk growth due to the very aggressive nature of the aluminum vapor. Metal carbide crucibles are also good candidates for AlN bulk growth.

The usual practice when sintering metal carbides is to introduce a high temperature binder so that the sintering temperature may be reduced. Cobalt is often used for this purpose, and allows a sintering temperature below 1600° C. In many applications, however, binders such as cobalt cannot be used due to contamination issues.

Embodiments of the invention include a binder-free process for sintering metal carbide objects for applications where the growth of SiC and GaN and related compounds is performed. Specifically, SiC crystal growth will benefit from sintered crucibles due to the very harsh environments inside the crucibles. The injectors in an HTCVD, PCS, or similar gas based techniques are especially exposed to harsh conditions, and TaC coated injectors will last for only one run before the coating fails. Here the sintered injectors are especially advantageous to use. The crucible can itself be made from sintered NbC and as it is conducting, it will couple to the RF field (used for heating) and generally behave as graphite, albeit the coupling will be different due to the much higher conductivity of the NbC. If the crucible is not made from NbC, one or more shells of NbC can be inserted inside the crucible. With several such shells stacked inside a crucible of a crystal growth reactor, and after more than 500 h of operation, no wear or erosion was seen on the surface of the shells. It is noted that tantalum carbide can also be used in place niobium carbide.

Hot isostatic pressing and other similar methods to sintering, can also be employed, however for simplicity only regular sintering will be described.

In an illustrative embodiment of the invention, an injector is 33 mm in outer diameter, 23 mm in inner diameter, and 100 mm long (approximately). It is made by pressing NbC powder up to 25 tons and sintering it at 2700° C.-3000° C. The sintered injectors shrink by 15-20% from their green body size. Naturally, the size of the green bodies must be selected to account for this shrinkage so that the finished parts are the correct size. Illustrative dimension ranges include: outer diameter: 25-35 mm; inner diameter: 15-25 mm; and length: 70-110 mm.

The sintered NbC is not attacked by the silicon vapors as a pure graphite injector is. The sintered NbC injectors are extremely durable; sintered NbC injectors have lasted in excess of 150 hours and more than 20 runs. Binderless and ultra high temperature sintering processes have been found to improve the lifetimes of the NbC injectors. Sintered NbC material such as this cannot be purchased from a standard sintering house, as furnaces reaching such high temperatures are very rare and the standard sintering house will typically use a low temperature (1600° C.) sintering with a cobalt binder.

Specific problems to be addressed are the pressing and the temperature uniformity during sintering. A higher pressure has to be applied for pressing larger diameter cylinders and hence requires a bigger press in order to reach the same pressure. Examples of alternatives to pressing include extruding, casting, and radial or isostatic pressing. Uniform temperature can be achieved by extending the length of the sintering zone and improving the insulation.

The fragility of the green bodies is of concern. Typically a small amount of a plastic binder is added that vaporizes or carbonizes at a few hundred degrees centigrade. The binder allows some handling after pressing, but typically no real machining can be done. After curing the green body, it can still be fragile and difficult to handle. A pre-sintering step can make the sintered metal-carbide parts more fully machineable.

Figure 3:
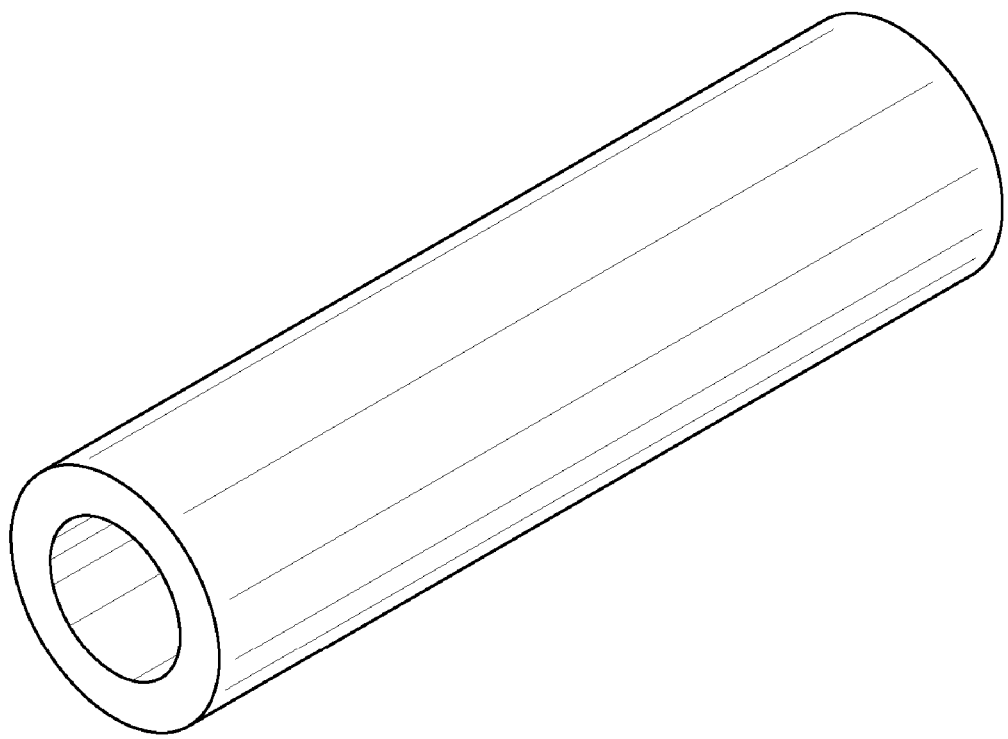
FIG. 3 depicts a perspective view of an injector according to an illustrative embodiment of the invention.

FIG. 3 depicts an injector according to an illustrative embodiment of the invention. Injector 300 is preferably tubular object. The dimensions are chosen based on the size of the reactor in which the injector is to be used, and based upon the physical characteristics of the process taking place in that reactor. In a particular embodiment of the invention, an injector has an outer diameter of about 30 to 35 mm, an inner diameter of about 20 to 25 mm, and a length of about 95 to 105 mm. In another embodiment, the injector has an outer diameter of about 33 mm, an inner diameter of about 23 mm, and a length of about 100 mm.

It appears that a relatively high-temperature environment (around 2000° C.) is beneficial for the NbC injectors. Little or no deposits occur on the NbC, and the absence of deposits reduces the induced stresses that cause the injectors to fail. Furthermore, as it appears that SiC does not have a tendency to stick to the NbC surface, there is very little downfall of particles, a commonly seen problem in HTCVD applications using regular graphite crucibles. The view port below the injector is usually clear from deposits even after a prolonged run.

Tested injectors of particular embodiments of the invention functioned for about one month of hard operation with several thermal cycles and extended periods of high temperature operation before deteriorating or failing. The cause of failure was unknown in most cases, but in some cases we have observed that a thick pyrolytic graphite coating is built up at the low temperature side of the injector. The pyrolytic graphite (PG) has a significantly different coefficient of thermal expansion (CTE) as compared to the NbC and when cooling down the PG can cause the injectors to crack. The growth of the PG is readily removed in between runs and is not typically a problem during the growth run.

Although it is preferred to construct a crucible of a metal carbide, graphite or other material crucibles can be modified to enjoy the benefits of metal carbides by lining them with shells.

Figure 4:
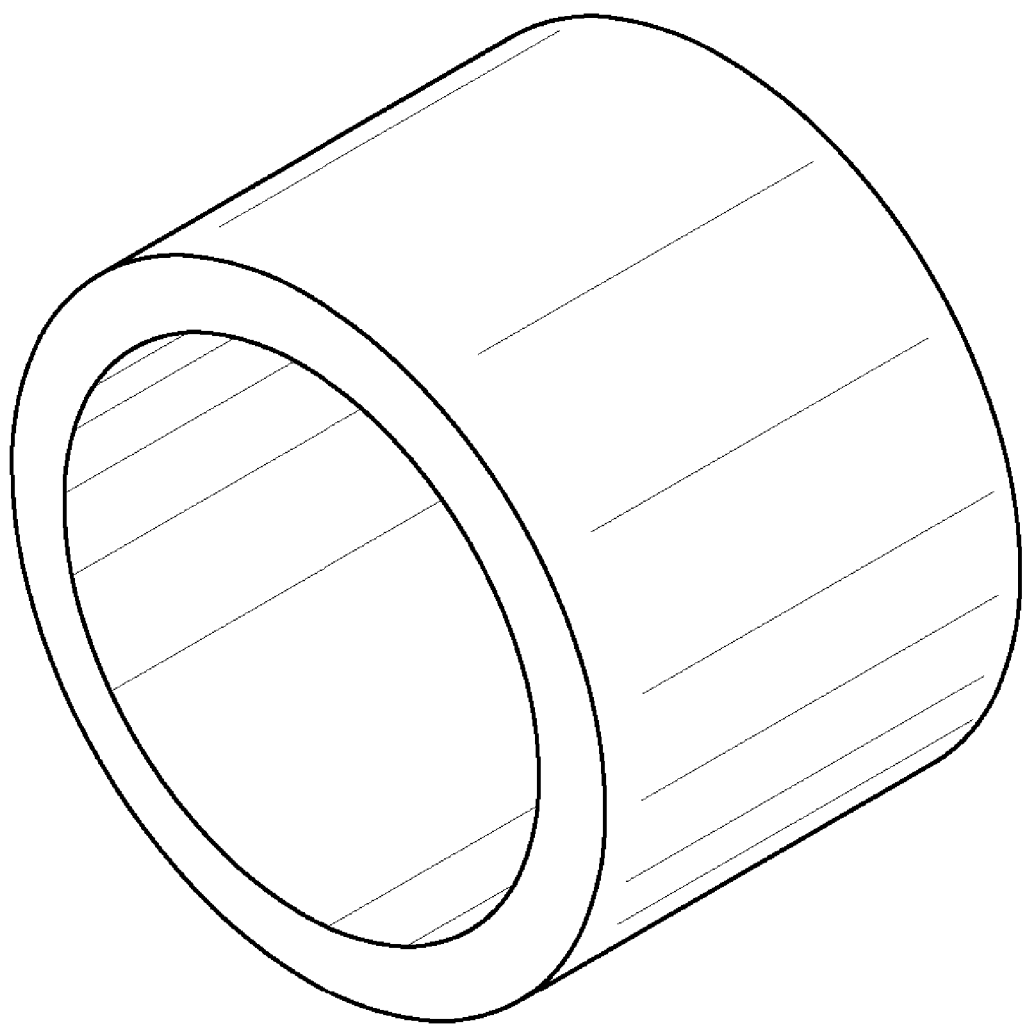
FIG. 4 depicts a perspective view of a shell for a protective liner according to an illustrative embodiment of the invention.

FIG. 4 depicts a metal carbide shell 400, according to an illustrative embodiment of the invention. The dimensions of each shell are chosen so that the shell may fit within and serve as a liner for the crucible used in a crystal growth reactor. The outer diameter of the shell is preferably slightly smaller than the inner diameter of the crucible in which it is to be used. Each shell may be shorter in length than the crucible in which it is used, in which case the NbC shells may be adapted to be stacked in the crucible. In a preferred embodiment of the invention, a NbC shell has an inner diameter from about 50 to 100 mm, an outer diameter of about 70 to 120 mm, and a length from about 60 mm to 200 mm. In a further embodiment, a NbC shell has an outer diameter of about 114 mm, an inner diameter of about 92 mm, and length from about 64 to 72 mm. The thickness of the shell is preferably chosen so that the shell will not occupy an undue portion of the volume of the crucible, but will still remain durable during the processes of manufacturing the shell and using the shell in a reactor. An illustrative thickness range includes about 5 mm to about 15 mm. A further illustrative range of shell thickness is about 7 mm to about 11 mm.

When NbC shells are used in the crucible, they are exposed to an even higher-temperature environment than that of the injectors. However, in the area of the shells the concentration of silicon vapor per surface area is lower than in the injectors.

Illustrative stacked shells can reduce the wear on the graphite crucible around the shells and they themselves have shown no signs of wear even after 500 h of growth. This together with the fact that the growth inside the crucible can be continuously monitored is a tremendous benefit. It is conceivable that other reactor parts can be lined with metal-carbide structures, but the crucible lends itself well to this practice because of its size.

Typically seed crystals are attached to a graphite disk in a reactor, which is threaded to a holder, which in turn is threaded to a shaft that rotates the seed holder. During crystal growth the sublimed microcrystallites deposit on the seed as single-crystalline material and on the bare graphite around the seed as poly SiC. This poly SiC growth is a nuisance from the point of view that during the growth cool down, due to the CTE mismatch between the graphite and the poly SiC, it can crack which in turn cracks the grown crystal. Also, if it does stay intact, this poly SiC has to be ground away, which can take several days of time depending upon the seed diameter. The seed diameter may vary from run to run, however the seed holder diameter remains the same to be cost effective.

Figure 5A:
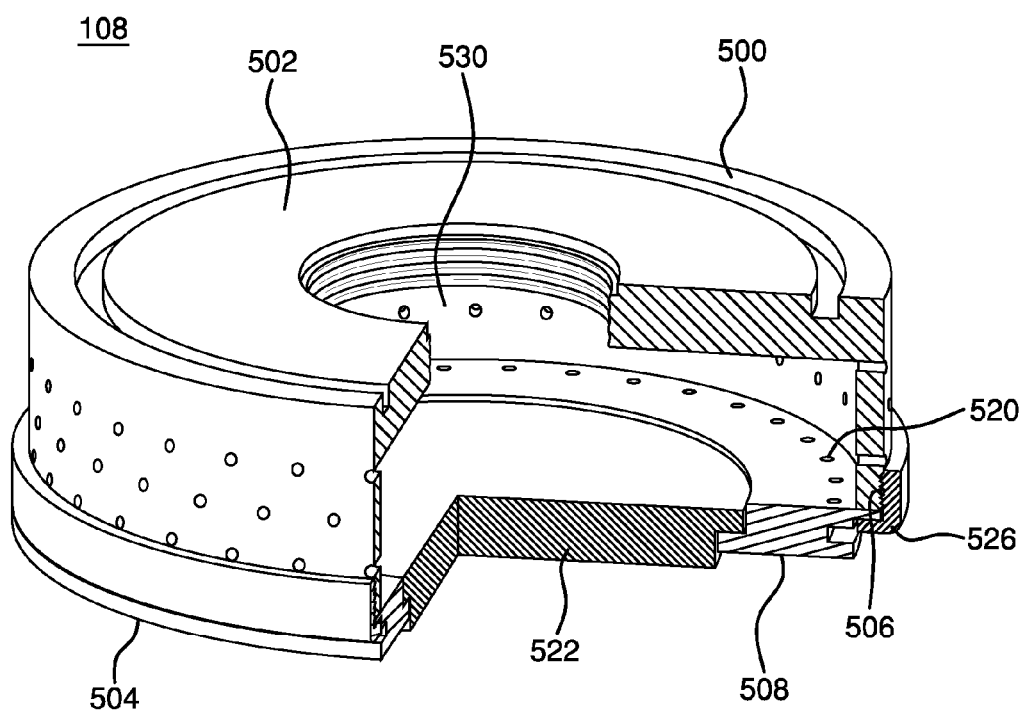
FIG. 5A depicts a seed holder according to an illustrative embodiment of the invention
Figure 5B:
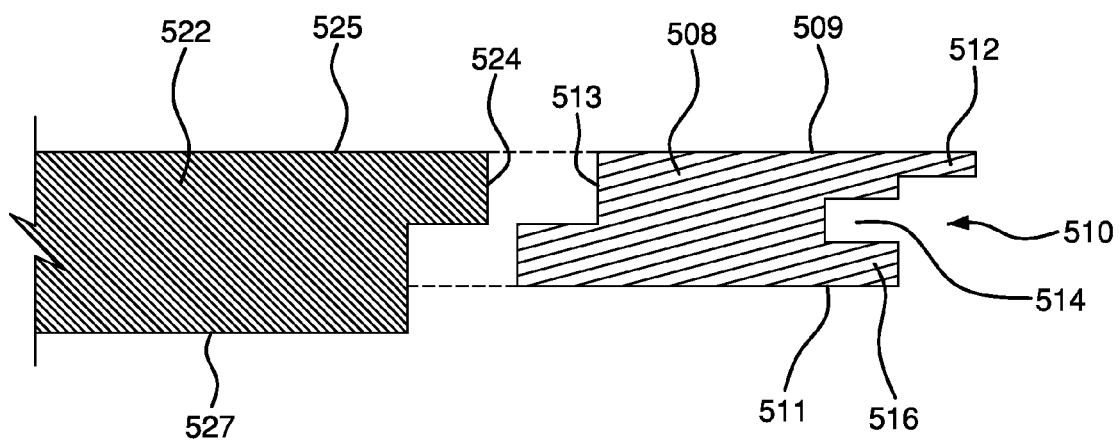
FIG. 5B depicts a cross section of the interface area of the drool and washer of FIG. 5A according to an illustrative embodiment of the invention.
Figure 6:
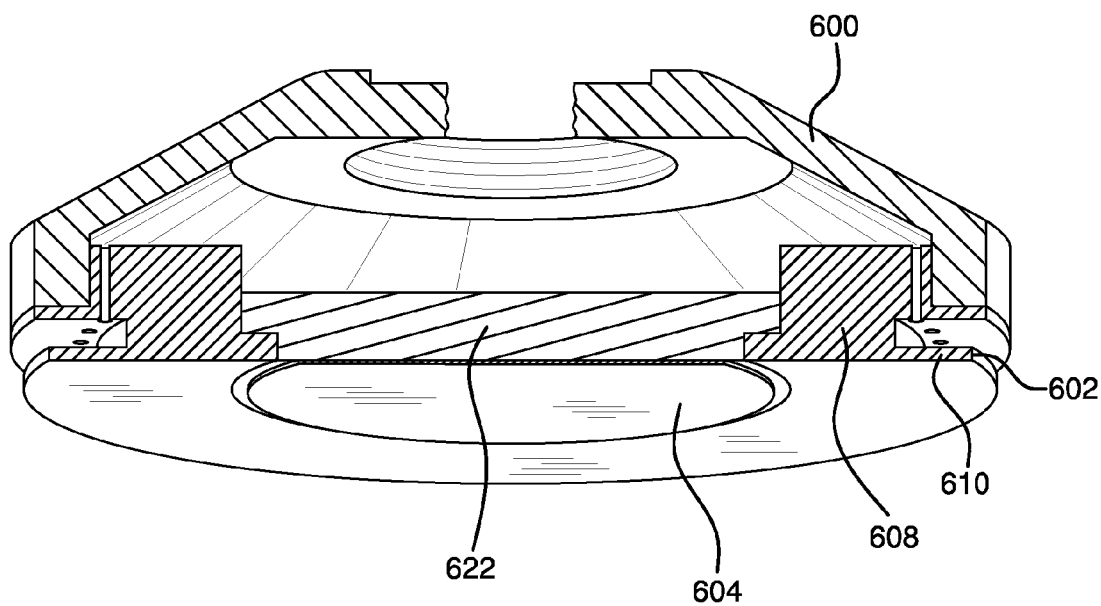
FIG. 6 depicts a seed holder according to a further embodiment of the invention.

To inhibit or prevent this unwanted poly SiC growth, embodiments of the invention provide a seed holder with a gas purge, with two concentric parts in place of one graphite disk. FIGS. 5A-B depict a seed holder 108 according to an illustrative embodiment of the invention. Seed holder 108 includes a main body 500 with top or proximal end 502, bottom or distal end 504, main aperture 530, and threads 506. (It is noted that the terms "top" and "bottom" are designations with respect to the seed holder being in the normal operating position. This, however, does not rule out that the apparatus can be disposed in a different orientation.) The main body 500 is preferably constructed of graphite. Drool 508 is attached to main body 500 by threaded ring 526. Threaded ring 526 is connected to the threaded connection of the distal end of the main body, the threaded ring being adapted to secure to the main body a ring-shaped body (the drool, in this case) having a diameter between the inner diameter of the distal end of the main body and the outer diameter of distal end of the main body. Threaded ring 526 is preferably made of graphite. An alternative washer and drool design is shown in FIG. 6. In this embodiment, a main body 600 has internal threads that engage with external threads on drool 608. This configuration inhibits deposits from forming directly above the drool on the holder. Dendritic deposits may also form on the edge 602 of the lower flange 610 of drool 608. By making edge 602 thinner (so that some of the etch gases may diffuse through the graphite) and the diameter slightly smaller than the main body diameter, to inhibit radiation to the cool outlet, can be reduce or eliminated. This can save significant amounts of etch gases, which are very expensive.

In an exemplary embodiment of the invention, lower flange 610 has a thickness in the range of about 1 mm to about 4 mm, and in a further illustrative embodiment the ranges is about 2 mm to about 3 mm. Illustrative drool diameter ranges, as measured on the drool bottom surface, include about 1 mm to about 20 mm smaller than the main body diameter, and about 3 mm to about 10 mm smaller than the main body diameter. Illustrative drool thicknesses include about 7 mm to about 25 mm and about 8 mm to about 19 mm, with a particular embodiment having a drool thickness of about 17 mm.

FIG. 6 also shows an alternative design for the main body 600. In this design, main body 600 is tapered so that growth that may appear on top of the holder on the edge will slide off the holder.

FIG. 5B provides a cross-section of the interface between drool 508 and washer 522, wherein drool 508 and washer 522 are shown displaced from one another to facilitate identification of the parts. Drool 508 is a ring-shaped body having a proximal end 509 and a distal end 511 and having an outer edge profile 510 and an inner edge profile 513, the outer edge profile 510 containing a first protrusion 512 near the proximal end 509, a slot 514, and a second protrusion 516 near the distal end 511, the first protrusion 512 having an outer diameter approximately equal to the inner diameter of the distal end 504 of the main body 500, the second protrusion 516 having a diameter between the inner diameter of the distal end 504 of the main body 500 and the outer diameter of distal end 504 of the main body 500. The first protrusion 512 has a plurality of apertures 520 therethrough, preferably about 2 mm in diameter, so as to create fluid communication between the interior of the main body 500 and the slot formed on the outer surface of the drool 508 as a result of the slot portion 514 of the outer edge profile 510 of the drool 508, and the inner edge profile 513 forming a notch about the inside surface of the drool 508. The drool 508, is preferably made of graphite.

Washer 522, on which the seed is attached, is preferably a solid disk of graphite that preferably is machined such that it is 2-7 mm larger in diameter than the seed. A typical seed diameter is three inches (76.2 mm), but other seed diameters are in the spirit and scope of the invention. The outer diameter of drool 508 is preferably 20-100% greater than the diameter of washer 522. In an exemplary embodiment of the invention, the washer diameter is in the range of about 50 mm to about 300 mm. In a further embodiment of the invention the washer diameter is in the range of about 75 mm to about 150 mm. Illustrative washer thickness ranges include about 5 mm to about 25 mm and about 7 mm to about 15 mm. Washer 522 has a proximal end 525 and a distal end 527, the outer surface of the washer 522 having an edge profile 524 forming a protrusion about the edge of the washer 522, the washer 522 resting on the proximal edge of the notch inside surface of the drool. In an alternative embodiment of the invention, such as shown in FIG. 6, surfaces of washer 622 and drool 608 are flush or the surfaces of seed 604 and drool 608 are flush i.e. in this case the washer surface is sunk into the drool a little bit. Experiments have shown that this can give a much flatter crystal surface (with improved crystallinity) and also a higher growth rate on the edge. The higher growth rate on the edge is ascribed to a reduction of the temperature at the edge of the washer resulting from the washer edge being hidden from the thermal radiation from the hot crucible. Experiments have shown that embodiments of the flush washer and drool design thus can give better material and more usable material. The growth rate is calculated from the point with the lowest thickness (usually the edge) and the inventors have found that with a higher growth rate there a more usable crystal is created that can be sliced and a higher quality crystal due to it being flatter. The flush design can further separate the drool and washer. The inventors have sometimes been able to directly pop out the grown crystal from the drool which has never been done with prior art designs. This is a significant achievement. It can save time and money in round grinding. Finally, since the washer is of slightly larger diameter (usually about 5 mm) than the seed the inventors have observed an immediate expansion of single crystal material over this additional graphite. That means that the crystal diameter will quickly expand to a larger diameter even though it is not grown for a long time.

Table 1 shows the flatness of crystals grown with seed holder having a washer flush with the drool.

TABLE 1

| Maximum Thickness | Minimum Thickness | Δt | % Variation |
|---|---|---|---|
| 2.85 | 2.49 | 0.36 | 6.74% |
| 5 | 5 | 0 | 0 |
| 4.12 | 3.7 | 0.42 | 5.37% |
| 5.31. | 4.7 | 0.61 | 6.09% |
| 4.07 | 3.53 | 0.54 | 7.11% |
| 5.2 | 4.55 | 0.65 | 6.67% |
| 3.96 | 3.94 | 0.02 | 0.25% |
| 1.46 | 1.34 | 0.12 | 4.29% |
| 4.73 | 4.62 | 0.11 | 1.18% |

Table 2 shows the flatness of crystals grown with a washer displaced below the drool.

TABLE 2

| Maximum Thickness | Minimum Thickness | Δt | % Variation |
|---|---|---|---|
| 2.12 | 1.13 | 0.99 | 30.46% |
| 2.7 | 1.82 | 0.88 | 19.47% |
| 4 | 2.4 | 1.6 | 25.00% |
| 2.02 | 1.2 | 0.82 | 25.47% |
| 3.75 | 2.24 | 1.51 | 25.21% |
| 1.47 | 0.76 | 0.71 | 31.84% |
| 1.79 | 0.93 | 0.86 | 31.62% |
| 1.67 | 1 | 0.67 | 25.09% |
| 1.76 | 1 | 0.76 | 27.54% |

The crystal profile can be adjusted by changing the spatial relationship between the washer and drool, in particular the relative positions of their bottom surfaces can be modified to affect the crystal characteristics. By having the drool flush with the washer, crystals can generally be grown having a percent variation between the thickest part of the crystal and the thinnest part of the crystal in the range of about 0 to about 10%. When the washer is displaced below the drool by about 3 mm to about 5 mm, the percent variation between the thickest part of the crystal and the thinnest part of the crystal is generally in the range of about 18% to about 32%. The edges of the crystals are generally the thinnest parts creating a convex shaped crystal.

Growth rate and hence crystal size can also be modified by adjusting the relative positions of the washer and drool. By having these components flush with one another, the average growth rate as measured on the edge can be increased by approximately 50% as compared to crystal growth under similar conditions. This means an increase in the efficiency of the process, and therefore the number of wafers you can slice from the crystal can also increase by approximately 50%.

Illustrative washer and drool dimension ranges include: about 100-170 mm drool outer diameter and about 50-100 mm washer.

The seed holder 108 is adapted so that gas flowing from the main aperture 530 into the volume enclosed by the main body 500 flows through the apertures 520 of the drool 508 and into the slot on the outer surface of the drool 508. The washer 522 sits inside the drool 508 and the drool is secured to the main body 500 using a threaded ring 526. With this design a small amount of purge gas entering through main aperture 530 will flow between the washer 522 and drool 508 to keep them separated. With this design the poly SiC growth is separated from the crystal without letting the etch gases etch the crystal. The drool 508 may have holes, of 1 mm for example, drilled in the drool that are preferably spaced about 2-2.5 mm apart. It may also be necessary to use etching gases such as HCl and hydrogen to effectively separate the two parts.

Etching gases are introduced below the threaded ring 526 but directed by the slot on the outer edge of drool 508 to inhibit the etching gases from interfering with the crystal growth. The etch gases will sweep (drool) over the edge of the ring 526 and remove any deposits on it. The drool 508 has a horizontal groove or narrow slot 514 on the edge as seen in FIG. 5B. In order to etch deposits on the holder ring or the outer edge of the holder that threads the drool to the holder, holes of preferably 2 mm diameter are drilled around this slot, so that the etch gases are directed in lateral direction and further follow the main gas stream.

Figure 7:
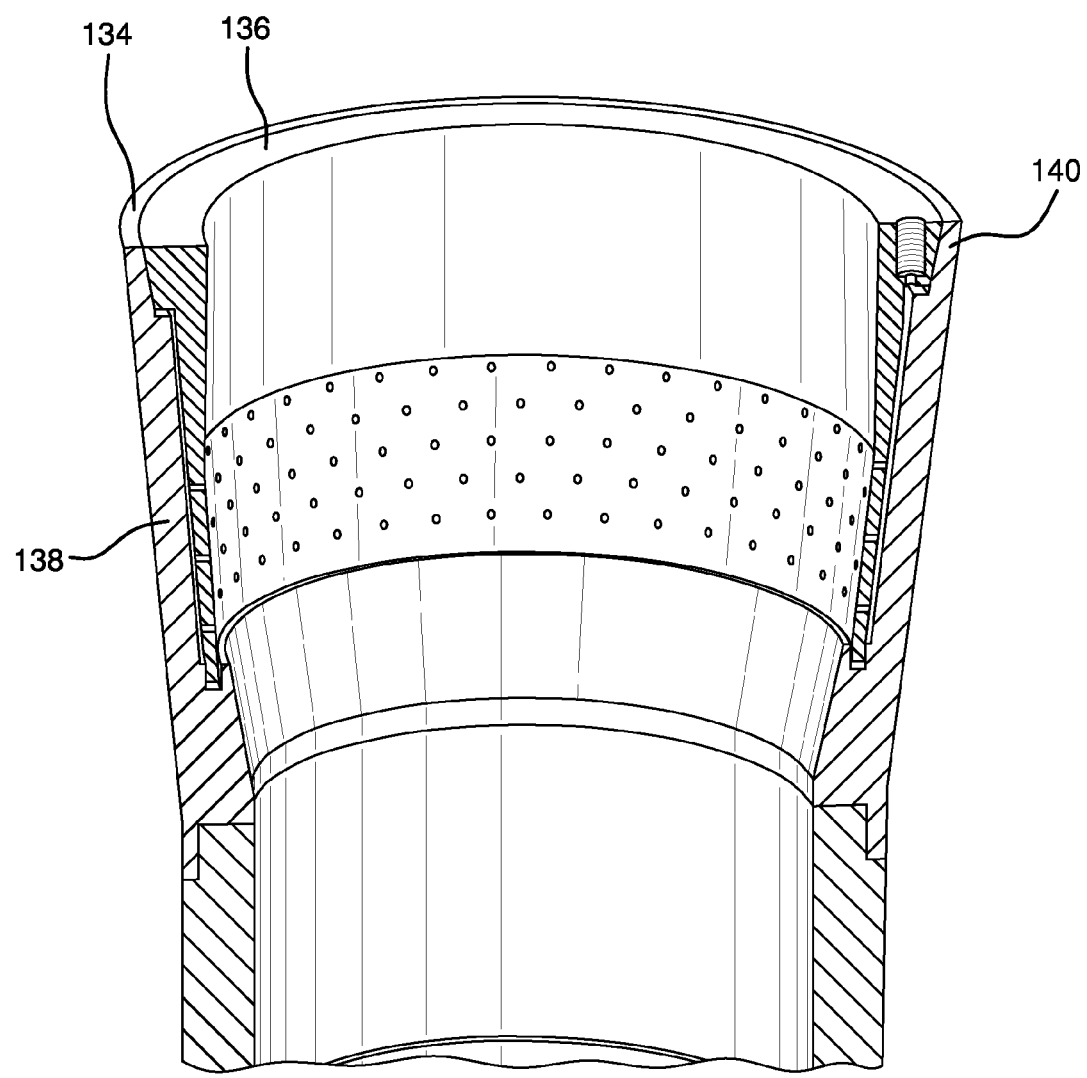
FIG. 7 depicts an upper portion of a reactor according to an illustrative embodiment of the invention.

Embodiments of the washer-drool design also help with blocking issues between the outlet 134 of the graphite crucible and the deposits on the seed holder. Etch gases such as hydrogen, chlorine and hydrogen chloride constantly flow in a shaft to the reactor interior in an area approximately level with the seed holder and above. Embodiments of the washer and drool design reduce or eliminate the blocking problems, without the need for the purge or etch concentric outlet structure as shown in FIGS. 1 and 7. The structure shown in FIGS. 1 and 7 can, however, be used with the drool and washer configuration and is within the spirit and scope of the invention. The concentric outlet includes an inner structure 136 and an outer structure 134. Outlet (or etch) holes 138 provide fluid communication between an inlet 140 and the reactor interior. Etch or purge gases are introduced through inlet 140 and generally surround the seed holder and flow to areas above it.

Figure 11:
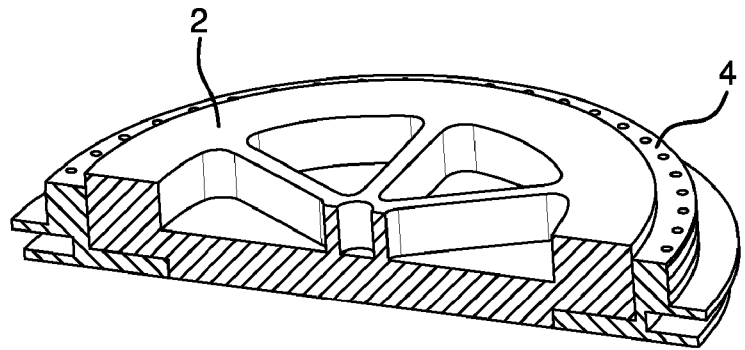
FIG. 11 depicts a washer and drool configuration according to an illustrative embodiment of the invention.
Figure 12:
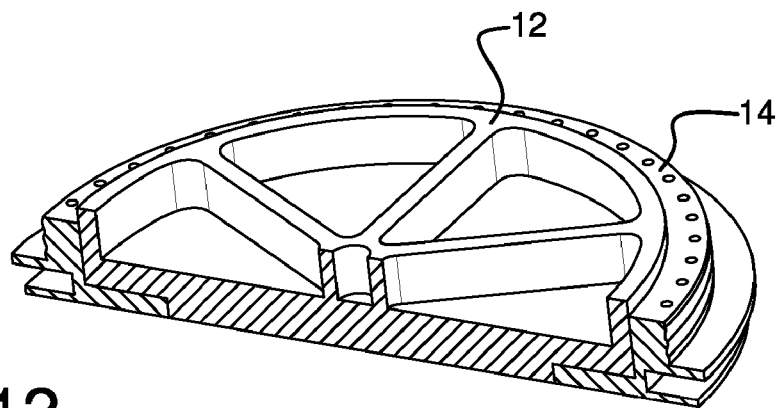
FIG. 12 depicts a washer and drool configuration according to another illustrative embodiment of the invention.
Figure 13:
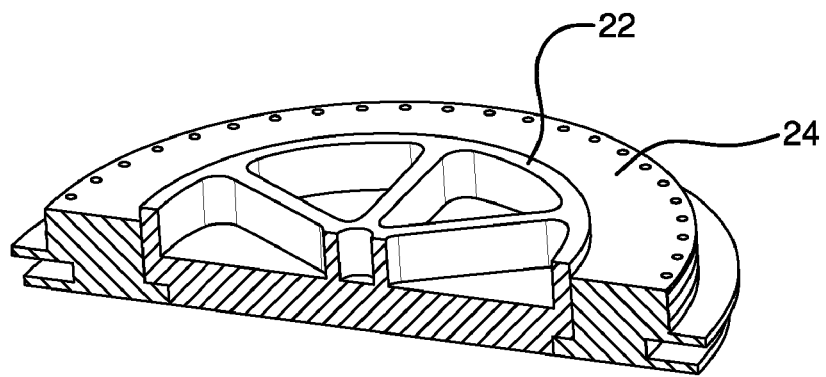
FIG. 13 depicts a washer and drool configuration according to yet another illustrative embodiment of the invention.

FIGS. 11-13 depict washer and drool configurations according to illustrative embodiments of the invention. It has been determined that thicker washers can reduce crystal cracking during the cooling down period. This is likely due, at least in part to the added stiffness of the washer. The drawback to using thicker washers is that it negatively affects the temperature gradient making the seed hotter than desirable. This can reduce growth rate. A solution is to make the backside of the washer much larger in diameter compared to the washer side onto which the seed is attached. This has been found to reduce the thermal gradient and increase the growth rate on the edges. Another solution is to carve out a portion of the backside (top) of the washer. FIGS. 11-13 show various embodiments in which a cartwheel pattern is carved out of the backside of the washer. Although the term "carve" is used, it is not meant to limit the methods by which the material is reduced on the washer. For example, the shape can be molded into the washer. This material reduction approach can provide a washer with nearly the same stiffness as a solid piece but having thermally behavior similar to a thinner washer.

In an illustrative embodiment of the invention, one or more carve outs reduce the washer material in the range of about 30% to about 80% by volume. In a further illustrative embodiment of the invention, the one or more carve outs reduce the washer material in the range of about 50% to about 60% by volume.

The material removed need not stretch all the way to the edge of the washer. Washer 2 of FIG. 11 has approximately the same diameter as the front side of the washer (i.e. the side on which the seed crystal is placed). Washer 12 of FIG. 12 and washer 22 of FIG. 13 have diameters larger than the front side of the washer. In an illustrative embodiment of the invention the difference in diameter between the top of the washer and the bottom is in the range of about 10 mm to about 50 mm. In a further illustrative embodiment the difference in diameter between the top of the washer and the bottom is in the range of about 15 mm to about 30 mm.

Figure 8:
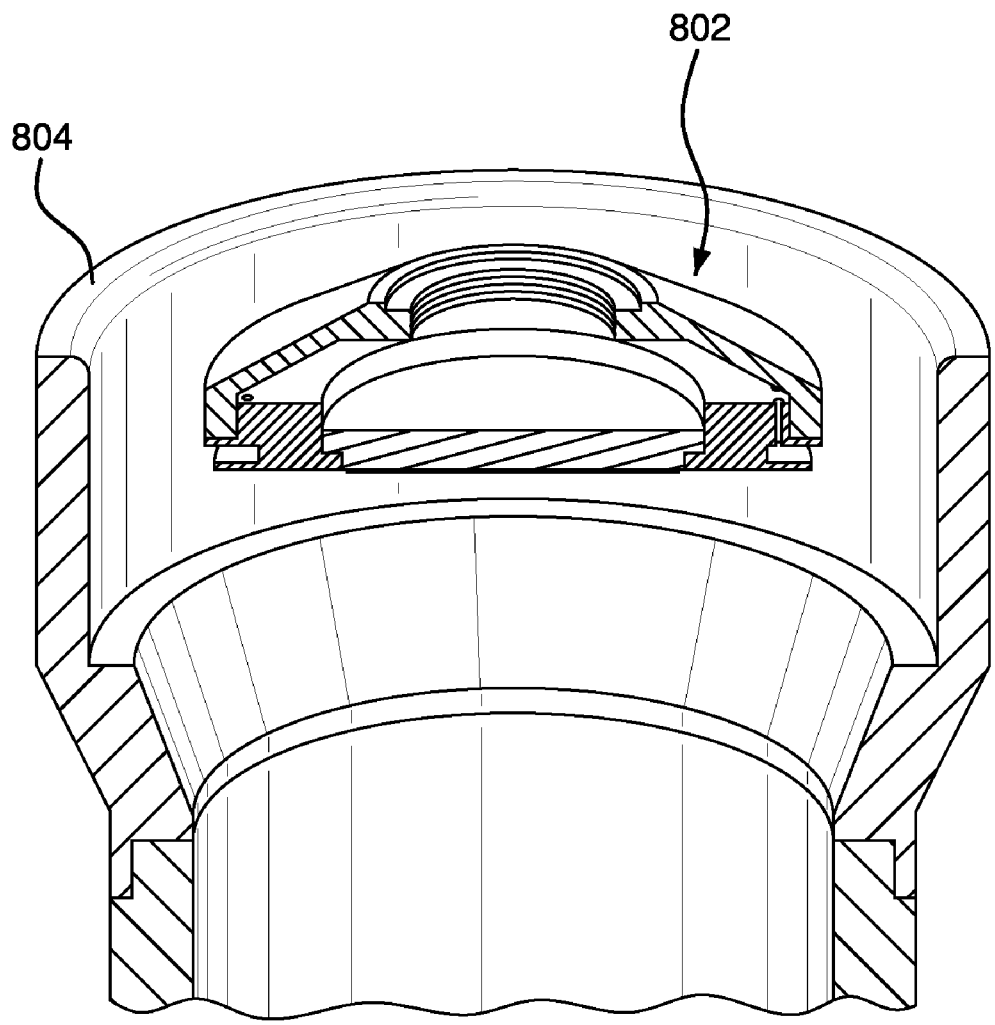
FIG. 8 depicts an upper portion of a reactor according to another illustrative embodiment of the invention.

The width of the drool can also vary in the washer material reduction designs and other washer/drool designs. FIG. 11 depicts a relatively large width drool 4, whereas FIGS. 12 and 13 depict drools 14 and 24, respectively, with smaller widths. Thicker drools may reduce cracking if the crystal grows together with the polycrystalline material on the drool. A thick drool gives stiffness and inhibits the polycrystal from bending. Additionally, with a thicker drool, the temperature on the hot side where the growth occurs is relatively high and consequently the poly material does not grow as fast. With lesser thicknesses, the poly material can grow faster than the single crystal material and eventually the poly can dominate over the single crystal. The poly can then encroach over the single crystal. With an appropriate thickness drool, the poly material will have a growth rate comparable to the crystal and so encroachment by the poly FIG. 8 depicts an outlet configuration that is suitable for use when blocking problems between the outlet and the seed holder are not a significant issue. Seed holder 802 is disposed within outlet 804. The inner outlet is eliminated because the drool and washer design as shown, reduces blocking issues that had before been addressed by the concentric outlet design.

Purge or etch gases that are introduced above the seed holder 108 can cause severe erosion on the backside of the graphite washer 522, hence forming an insulating layer of graphite powder behind the washer. For this reason the shape of the crystal will turn concave as the insulating graphite powder makes the crystal hotter in the center. A concave crystal is marred by poor crystalline structure, and a flat or somewhat convex shape is much preferred. Furthermore, the temperature of the crystal is read from the back of the washer and this reading becomes obscured by the insulating graphite powder generated by the etch gases. Therefore, it is common practice to gradually ramp the (observed) temperature down in an attempt to keep the temperature at the growth interface constant. To alleviate these issues, the top or proximal side of the washer may be painted with a solution including one or more of niobium, niobium carbide, and tungsten, along with a binder that is easily dissolved in organic solvents, such as ethanol, isopropanol or acetone or even water based binder. The paint does not allow the graphite to be etched off aggressively and provides a certain level of consistency. This paint can also be used to coat the inside of a graphite crucible or to coat other reactor components.

A method of growing crystals includes providing a reactor with one or more of the inventive components or utilizing one or more methods described above; attaching a seed crystal to the seed holder; placing the seed holder in an operative position within the crucible; and introducing into the crucible a flow of precursor gases allowing for growth of the crystal product on the seed crystal so that a boule or epitaxial layer forms upon the seed crystal. An etch gas may also be introduced into the main body of the seed holder for reducing the amount of unwanted polycrystalline growth forming upon the surface of the boule. Following is a description of some process parameters according to illustrative embodiments of the invention.

In an illustrative embodiment of the invention, the temperature is in the range of about 2200° C. to about 2270° C., as measured on the top surface of the graphite washer. Depending on the thickness and thermal conductivity of the graphite washer the seed temperature is estimated to be about 10° C. to about 70° C. higher.

An illustrative lower temperature limit is about 2000° C., and an illustrative upper temperature limit is about 2300° C. Below 2000° C. the growth rate is usually low or the quality is bad. Above 2300° C. the growth rate decreases due to sublimation and etching of your material. The high rate of sublimation can also give a graphitized surface if your flows, pressure, or temperature readings are slightly off which easily happens if the system drifts. These effects of course are also dependent to some extent on other process parameters.

Also, in an illustrative embodiment of the invention the bottom temperature is in the range of about 2400° C. to about 2530° C., as measured in a 30-40 mm deep slot located at the bottom of the crucible and penetrating into the cylinder side wall of the crucible. The highest temperature in the crucible is believed to be even higher than this (by estimation about 70° C. to about 150° C. higher). The temperature needs to be higher by about 200° C. to about 300° C. in order to efficiently sublime the microcrystals. Historically the inventors have had a thermal gradient between about 100° C. to about 320° C.

An illustrative minimum bottom temperature is about 2300° C. This, however, can be inefficient. An illustrative upper temperature is about 2600° C. on the bottom. The typical delta T or thermal gradient as mentioned is about 200° C. to about 300° C., but positive growth can be achieved with both lower and higher delta T. Important is that the delta T is high enough so that the microcrystals sublime completely as they travel towards the seed.

Following are precursor flows according to an illustrative embodiment of the invention. Silane, or other comparable precursor is introduced at about 400 sccm to about 800 sccm. A flow that is too high can easily block the passageways in the reactor. Illustrative ethylene flows are between about 200 sccm and about 300 sccm. Typical C/Si ratios are between about 0.3 and about 0.7. Higher C/Si can give carbon clusters that will cause micropipes or poor quality material but it will also give pretty good spiral growth. Low C/Si can give 3C inclusions and "smiley faces" which are defects generated by polytype flipping.

In an illustrative embodiment of the invention, in the center line where the precursors flow a flow of helium carrier gas is also introduced. An exemplary flow rate is about 1 SLM with an exemplary range of about 0.75 SLM and 1.25 SLM. A blend of He and $H_2$. Because of the reactivity of $H_2$, it typically makes the clusters smaller and easier to sublime. Argon may be used in the center as well, either with or without other carrier gases. The typical carrier flows in the center range between about 0 to about 1 SLM. Higher than 2 SLM is likely going to cause problems with the material. An illustrative He/$H_2$ blend is between about 100% He to about 0% He.

[00096] In an exemplary embodiment of the invention, the outer flow is a blend of He and Ar. $H_2$ may also be added but in most circumstances it is better to add the $H_2$ in the center because $H_2$ is reactive and the flow outside the center flow should act as an inert wall. Experimentally it has been found that the best results from a flow perspective i.e. to avoid depositions on the inlet and to observe the sample is if only Ar is used. But initial results have shown that only Ar gives somewhat worse material quality. Accordingly, a blend is usually likely the best solution. Illustrative parameters are as follows: An illustrative Ar flow is between about 0.4 SLM and about 0.5 SLM. An illustrative He flow is about 1 SLM to about 5 SLM. The higher flows give lower growth rate and worse crystal quality. Low flows give higher growth rate and good crystal quality but require a higher delta T. Exemplary flow ranges include about 1.2 SLM He with about 0.4 SLM Ar, and about 1.5 SLM He with about 0.5 SLM Ar.

Illustrative etchant flows through the shaft to the sample holder are about HCl 0.3 to about 1 SLM. It is possible to go about as high as 3 SLM but an upper limit usually need not be any higher than about 0.7, with He (or Ar) flow of about 1 SLM to about 3 SLM with about 1 SLM to about 5 SLM of H2. An exemplary combination is about 0.7 HCl, about 2 SLM He, and about 3 SLM $H_2$. Overall an illustrative etchant flow rate range is about 0.3 SLM to about 3 SLM.

In an illustrative embodiment of the invention the process pressure is between about 200 torr to about 800 torr. Low pressures usually result in lower growth rates and the material can be pulled through the reactor without depositing on the sample. It can also give dome shaped crystals (thicker in the center). Carrier flows can also alter the shape of the crystals depending on other conditions. The low pressures (around 300 torr) are generally preferred as the delta T can be kept low. Low pressures generally result in smaller clusters as the probability for homogeneous nucleation (gas phase clustering) decreases. With an optimum delta T the process can be run at higher pressures, for example from about 500 torr to about atmospheric pressure or slightly above. This will generally give better efficiency and better quality crystals. Insulation of the reactor can play an important role in maintaining optimum delta T.

Figure 9:
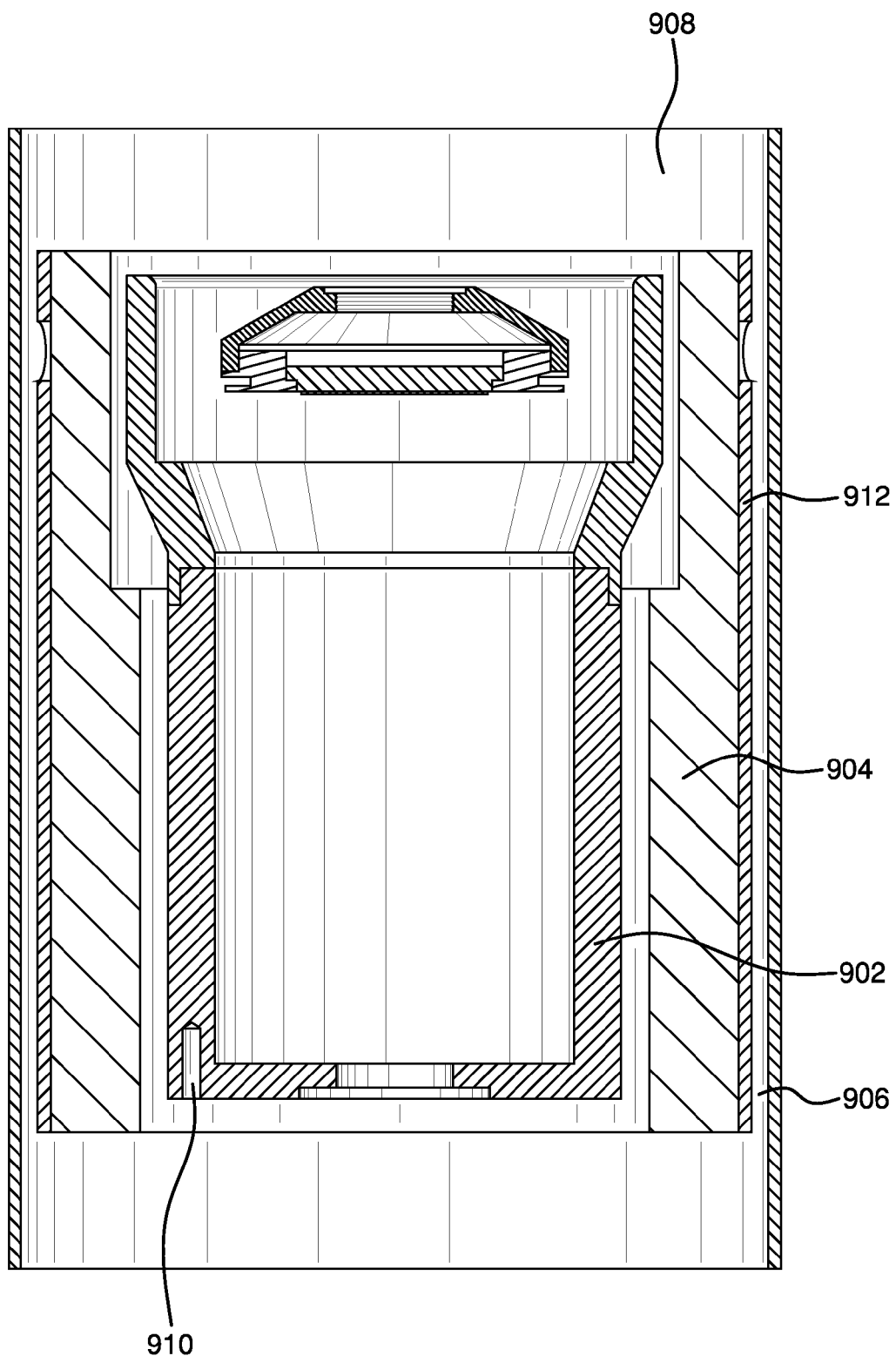
FIG. 9 depicts a reactor apparatus with surrounding insulation according to an illustrative embodiment of the invention.
Figure 10:
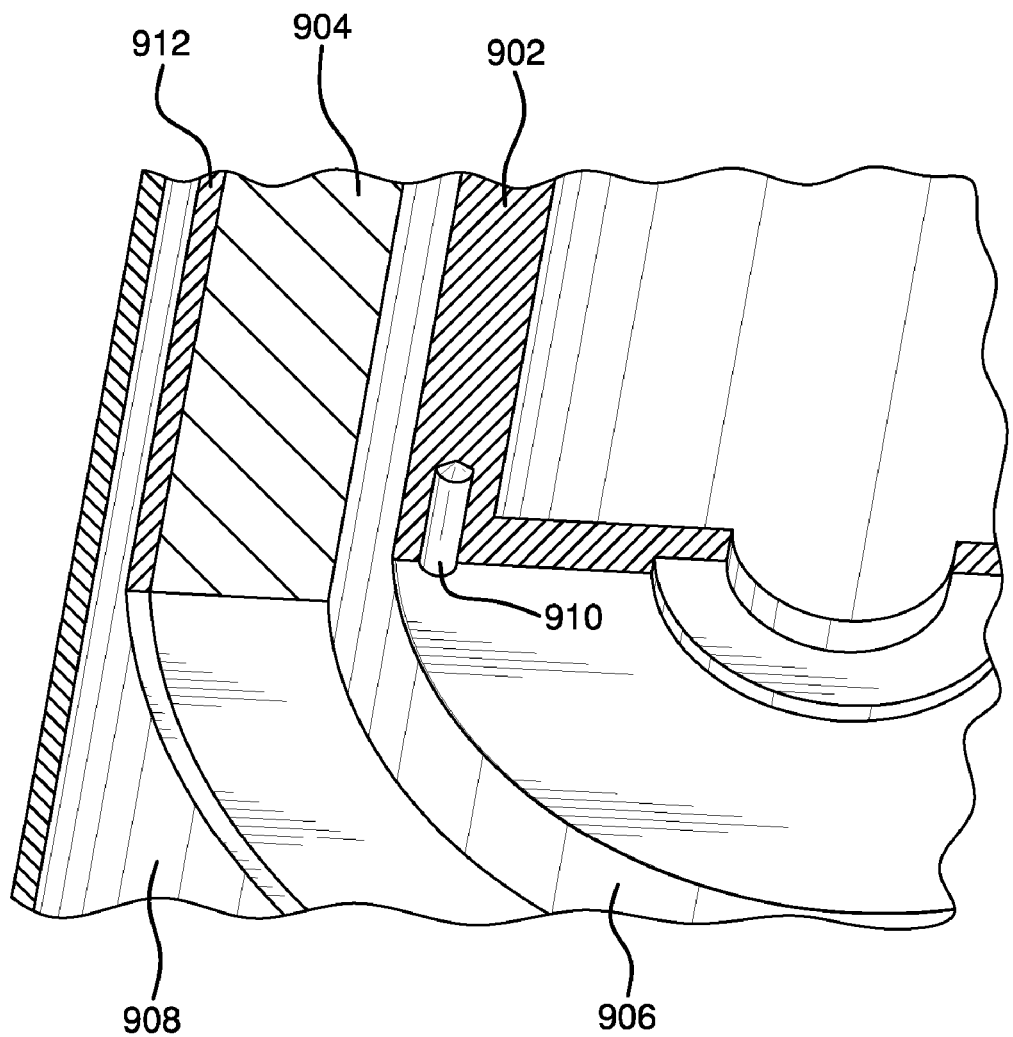
FIG. 10 depicts a close-up of a portion of the reactor apparatus of FIG. 9 according to an illustrative embodiment of the invention.

FIG. 9 depicts a reactor apparatus with surrounding insulation according to an illustrative embodiment of the invention. FIG. 10 depicts a close up of a portion of the reactor apparatus of FIG. 9. The crucible wall 902 is surrounded by insulation 904, which helps maintain the necessary temperature for the crystal growth process. Between crucible wall 902 and insulation 904 is a gap 906. The gap is optional however a reduced temperature drift can be achieved by providing the gap, particularly if argon or a similar gas (for example another inert gas or gases) is flowed into the gap. An illustrative gap width range is about 3 mm to about 6 mm, with an exemplary gap width of about 5 mm. Benefits of the gas flow in the gap can be seen when the flow rate approaches approximately 11 SLM. Optimum flow rate for particular reactor configurations and process temperatures are in the range of about 10 SLM to about 35 SLM, with an exemplary range of about 18 SLM to about 20 SLM. Without the gas flow in the gap, insulation typically must be changes after each crystal growth run because of insulation degradation. The inventors have found that insulation can last ten runs when a gas flow is implemented in the gap between the insulation and the crucible wall.

An outer quartz tube 908 is shown disposed around a quartz liner 912. Not shown would typically be a water-cooling system outside of the outer quartz tube and an rf coil around outer quartz tube 908 and the water cooling system.

An illustrative insulation material is graphite felt. The advantage of the graphite felt is that it couples less to the rf field than rigid fiber insulation. In an exemplary embodiment of the invention ½ inch felt it wrapped around three layers thick.

Also shown in FIGS. 9 and 10 is a slot 910 in the crucible wall for pyrometer measurements.

The invention further includes a crystal, such as in the form of a boule or epitaxial layer formed according to the methods, and using one or more of the devices and systems, described herein, and a semiconductor device having such a crystal. Crystals grown according to embodiments of the invention may generally have improved crystal characteristics, such as those described above. The semiconductor device may be or include for example, a complimentary metal oxide semiconductor (CMOS) device, micro-electro-mechanical (MEM) device, field effect transistor (FET), bipolar junction transistor (BJT), insulated gate bipolar transistor (IGBT), gate turn-off thyristor (GTO), or Schottky diode.

While the invention has been described by illustrative embodiments, additional advantages and modifications will occur to those skilled in the art. Therefore, the invention in its broader aspects is not limited to specific details shown and described herein. Modifications, for example, to the types of metal carbides, component dimensions, and other parameters may be made without departing from the spirit and scope of the invention. Accordingly, it is intended that the invention not be limited to the specific illustrative embodiments, but be interpreted within the full spirit and scope of the appended claims and their equivalents.

The invention claimed is:

1. A crystal growth process comprising:
   providing a reactor having a crucible with an injector apparatus for injecting material into the reactor, and a seed holder on which crystal growth takes place;
   wherein the injector apparatus has an inner gas conduit and an outer gas conduit, both terminating in a lower injector, and further which has an upper gas injector extending into a crucible of the reactor;
   providing a gap between the upper injector and the lower injector;
   maintaining the upper injector at a higher temperature than the lower injector;
   providing a seed crystal on the seed holder;
   introducing into the reactor through the injector apparatus, a flow of one or more precursors to cause crystal growth;
   introducing into the reactor through the outer gas conduit, a flow of inert gas.

2. The crystal growth process of claim 1 wherein the inert gas is a gas with an atomic weight greater than 28 amu.

3. The crystal growth process of claim 1 wherein the inert gas is argon.

4. The crystal growth process of claim 1 wherein the inert gas is krypton.

5. The crystal growth process of claim 1 wherein the inert gas is xenon.

6. The crystal growth process of claim 1 wherein the inert gas is a mixture of argon and helium.

7. The crystal growth process of claim 1 wherein the crystal growth process is a gas phase bulk growth process.

8. The crystal growth process of claim 1 wherein the temperature is in the range of about 2000° C. to about 2400° C. as measured on a top surface of the washer holding the seed crystal.

9. The crystal growth process of claim 8 wherein the temperature is in the range of about 2200° C. to about 2270° C. as measured on a top surface of the washer holding the seed crystal.

10. The crystal growth process of claim 1 wherein the bottom temperature is in the range of about 2300° C. to about 2600° C., as measured in a 30-40 mm deep slot located at the bottom of the crucible and penetrating into the a side wall of the crucible.

11. The crystal growth process of claim 1 wherein the bottom temperature is in the range of about 2400° C. to about 2530° C., as measured in a 30-40 mm deep slot located at the bottom of the crucible and penetrating into the a side wall of the crucible.

12. The crystal growth process of claim 1 wherein the thermal gradient between the top surface of the washer and the bottom of the crucible is in the range of about 200° C. to about 300° C.

13. The crystal growth process of claim 1 wherein a silicon precursor has a flow rate of about 400 sccm to about 800 sccm.

14. The crystal growth process of claim 13 wherein the silicon precursor is silane.

15. The crystal growth process of claim 1 wherein the carbon precursor flow rate is in the range of about 200 sccm to about 300 sccm.

16. The crystal growth process of claim 12 wherein the carbon precursor is ethylene.

17. The crystal growth process of claim 1 wherein the carbon precursor to silicon precursor ration is in the range of about 0.3 and about 0.7.

18. The crystal growth process of claim 1 wherein a carrier gas is introduced in the inner conduit with the precursors at a flow rate of less than about 1 SLM.

19. The crystal growth process of claim 1 wherein helium is introduced into the inner gas conduit with the precursor flow.

20. The crystal growth process of claim 1 wherein a mixture of helium and hydrogen are introduced into the inner gas conduit with the precursor flow.

21. The crystal growth process of claim 6 wherein the argon flow in the outer conduit is in the range about 0.4 SLM to about 1.0 SLM.

22. The crystal growth process of claim 6 wherein the helium flow in the outer conduit is in the range about 1 SLM to about 5 SLM.

23. The crystal growth process of claim 6 wherein the helium flow is about 1.2 SLM and the argon flow is about 0.4 SLM.

24. The crystal growth process of claim 6 wherein the helium flow is about 1.5 SLM and the argon flow is about 0.5 SLM.

25. The crystal growth process of claim 1 further comprising a flow of etchant through a shaft to the seed holder in the range of about 0.3 SLM to about 3 SLM.

26. The crystal growth process of claim 25 wherein the etchant is HCl.

27. The crystal growth process of claim 25 comprising a flow rate of helium, argon, or a combination thereof in the range of about 1 SLM to about 3 SLM.

28. The crystal growth process of claim 27 comprising the flow rate of hydrogen in the range of about 1 SLM to about 5 SLM.

29. The crystal growth process of claim 26 wherein the flow rate of HCl is about 0.7, and comprising a flow of helium at a rate of about 2 SLM and a flow rate of hydrogen at a rate of about 3 SLM.

30. The crystal growth process of claim 1 wherein the pressure is in the range about 200 torr to about 800 torr.

31. The crystal growth process of claim 1 wherein the temperature difference between the upper injector and the lower injector is on the range of about 50° C. to about 100° C.

32. The crystal growth process of claim 1 wherein the seed holder comprises:
   a drool and a washer disposed around the drool to form the seed holder;
   a main body disposed over the washer and drool, forming an enclosure above the washer and drool, the enclosure forming a cavity above the washer and drool;
   one or more main body apertures in the main body for the introduction of gases into the cavity;
   wherein gases introduced into the cavity can seep through an interface between the drool inner edge and the washer outer edge.

33. The crystal growth process of claim 32 wherein the circumference of the seed holder main body decreases over at least a portion of the main body extending from a point nearer to the crucible to a point farther from the crucible.

34. The crystal growth process of claim 32 wherein the washer comprises one or more carve outs to regulate the temperature gradient.

35. The crystal growth process of claim 32 wherein the top of the washer has a larger diameter than the bottom of the washer.

36. The crystal growth process of claim 1 further comprising:
   providing insulation around at least the crucible with a gap therebetween; and
   flowing a gas in the gap to reduce insulation degradation.

37. The crystal growth process of claim 36 wherein the gas is argon.

38. The crystal growth method of claim 32 further comprising:
   providing a graphite-etching inhibitor coating on a top surface of the washer.

39. The crystal growth method of claim 32 wherein the washer is about 2 mm to about 7 mm larger in diameter than the seed.

40. The crystal growth method of claim 1 wherein the upper injector is comprised of a metal carbide.

41. The crystal growth method of claim 40 wherein the upper injector is comprised on niobium carbide.

42. The crystal growth method of claim 40 wherein the upper injector is comprised on tantalum carbide.

43. The crystal growth method of claim 40 wherein the upper injector is comprised on tungsten carbide.

44. A crystal grown according to the growth method of claim 1.

45. A semiconductor device comprising the crystal of claim 44.

46. A method of insulating a crystal growth reactor comprising:
   providing insulation disposed around at least a crucible and outlet section of the reactor apparatus;
   providing a gap between the insulation and the crucible and outlet section;
   flowing an inert gas into the gap.

47. The method of claim 46 wherein the gas is argon.

48. The method of claim 46 wherein the flow rate of the gas is in the range of about 10 SLM to about 35 SLM.

49. The method of claim 48 wherein the flow rate of the gas is in the range of about 18 SLM to about 20 SLM.

50. The method of claim 46 wherein the gap width is in the range of about 3 mm to about 6 mm.

51. The method of claim 50 wherein the gap width is about 5 mm.

* * * * *